United States Patent [19]

Mays

[11] Patent Number: 4,590,408
[45] Date of Patent: May 20, 1986

[54] LINEAR/RESONANT CRT BEAM DEFLECTION CIRCUIT

[75] Inventor: Joe A. Mays, Xenia, Ohio

[73] Assignee: Systems Research Laboratories, Inc., Dayton, Ohio

[21] Appl. No.: 608,066

[22] Filed: May 8, 1984

[51] Int. Cl.$^4$ ............................................. H01J 29/70
[52] U.S. Cl. ................................... 315/403; 315/387; 315/408
[58] Field of Search ........................ 315/403, 408, 387

[56] References Cited

U.S. PATENT DOCUMENTS

| | | | |
|---|---|---|---|
| 3,628,083 | 12/1971 | Holmes et al. | 315/27 |
| 3,816,792 | 6/1974 | Spencer, Jr. | 315/27 |
| 4,100,464 | 7/1978 | Ovenden | 315/397 |
| 4,297,621 | 10/1981 | Spilsbury | 315/397 |
| 4,404,499 | 9/1983 | Ryan | 315/403 |
| 4,491,835 | 1/1985 | Aron | 315/403 |

Primary Examiner—Theodore M. Blum
Assistant Examiner—David Cain
Attorney, Agent, or Firm—Biebel, French & Nauman

[57] ABSTRACT

In a dual mode CRT deflection circuit, a capacitor for effecting rapid retrace of the CRT beam by means of resonant nonlinear operation is selectively shunted such that beam deflection may be linearly controlled. A bidirectional switch preferably comprising a field effect transistor (FET) is connected in parallel with the capacitor which in turn is connected in series with the deflection coil of the CRT with the series combination being driven by an amplifier in response to beam positioning signals. When the bidirectional switch is activated to shunt the capacitor, the deflection control circuit operates in a linear mode; and when the switch is deactivated, the deflection coil of the CRT interacts with the capacitor for resonant nonlinear operation. A comparator circuit is connected to the output of the amplifier and coupled to the bidirectional switch through an optical coupler to activate and deactivate the switch in response to conditions within the deflection control circuit. Two capacitors and associated FET shunting circuits are provided for bidirectional resonant nonlinear operation, with the deflection coil being connected in series between the two capacitors.

4 Claims, 4 Drawing Figures

LINEAR/RESONANT CRT BEAM DEFLECTION CIRCUIT

BACKGROUND OF THE INVENTION

The present invention relates generally to cathode ray tube beam deflection circuits and more particularly to beam deflection circuits which permit both linear and resonant nonlinear operating modes.

Linear amplifiers are able to deflect the electron beam in a cathode ray tube (CRT) with great precision in response to complex input drive signals. Hence, linear deflection amplifiers are capable of being used to display a variety of scan formats including stroke, dot and raster. The chief disadvantage of linear deflection amplifiers is the extremely high power required to perform the rapid retrace with raster scan formats.

Resonant flyback amplifiers are widely used in raster scan displays due to their inherent simplicity and efficiency in rapidly retracing the electron beam. However, resonant flyback deflection amplifiers have relatively poor linearity and are thus limited to the raster scan format.

In the prior art, linear and resonant flyback or nonlinear deflection have been combined to provide the benefits of both types of CRT beam deflection. For example, Spilsbury U.S. Pat. No. 4,297,621 discloses a dual mode cathode ray beam deflection circuit. In Spilsbury, the deflection coil of a CRT is connected as the load of a push/pull amplifier. The negative half of the push/pull amplifier is connected to the deflection coil by means of a field effect transistor (FET) and the postive half of the push/pull amplifier is connected through a capacitor which is bypassed by a diode during linear operation of the deflection circuit.

For resonant flyback or nonlinear operation of the Spilsbury deflection circuit, a flyback drive pulse from an external generator is applied through a transformer to bias the FET into a nonconducting state such that the negative half of the push/pull amplifier is abruptly disconnected from the deflection coil. The diode bypassing the capacitor is reverse biased such that the deflection coil resonates with the capacitor connected to the positive half of the amplifier and is connected to a positive power supply through the capacitor and a second diode to effect rapid retrace.

Since the deflection coil is disconnected from the negative half of the push/pull amplifier in Spilsbury, the push/pull amplifier cannot be used to enhance resonant flyback or nonlinear operation. Further, externally generated drive pulses must be provided to change the deflection system from linear to resonant nonlinear operation and resonant or nonlinear operation can be effected in only one direction.

It is thus apparent that the need exists for an improved cathode ray tube beam deflection circuit which permits dual mode operation in both linear and resonant nonlinear modes without disconnection of a driving amplifier during resonant nonlinear operation, provides for internal switching between the two modes of operation and can provide for bidirectional resonant nonlinear operation to accommodate complex beam driving signals which include rapid changes or beam retrace in either direction.

SUMMARY OF THE INVENTION

The shortcomings of the prior art are overcome by the dual mode deflection circuit of the present invention which drives the deflection coil of a cathode ray tube (CRT) to position the beam along one coordinate. A capacitor for effecting rapid retrace of the cathode ray tube beam by means of resonant nonlinear operation is selectively shunted by a bidirectional switch such that beam deflection may be linearly controlled. The bidirectional switch is connected in parallel with the capacitor which in turn is connected in series with the deflection coil of the cathode ray tube with the series combination being driven by an amplifier in response to beam positioning signals. When the bidirectional switch is activated to shunt the capacitor, the deflection control circuit operates in a linear mode and when the switch is deactivated the deflection coil of the cathode ray tube interacts with the capacitor for resonant nonlinear operation.

The bidirectional switch of the present invention can be controlled externally by means of a flyback drive pulse. However, control means, preferably in the form of a comparator circuit, are connected to the output of the amplifier and coupled to the bidirectional switch to activate and deactivate the switch in response to conditions within the deflection control circuit. In this way, if the deflection circuit is unable to perform a sufficiently rapid movement of the beam in the linear mode of operation, it switches to a resonant nonlinear mode to accomplish the movement. Since the circuit amplifier is connected and active during both linear and resonant nonlinear operatin, the full capability of the amplifier is available during both operating modes of the deflection circuit.

In accordance with the series connection of the capacitor and the deflection coil, and the capacitor shorting arrangement of the present invention, the deflection circuit is able to operate in the resonant nonlinear mode in either direction to accommodate use of the deflection circuit for complex beam control signals. The bidirectional switch preferably comprises a field effect transistor (FET) driven by an optical coupler which, in turn, is driven by the comparator circuit. Two capacitors are provided for bidirectional resonant nonlinear operation with the deflection coil being connected in series between the two capacitors. Two capacitors are preferred due to the characteristics of presently available FET devices which, when deactivated, can block high voltage levels generated by resonant nonlinear operation in only one direction.

It is, therefore, an object of the present invention to provide an improved cathode ray tube beam deflection circuit which permits a beam deflection amplifier to remain active and connected during both linear and resonant nonlinear operation of the deflection circuit; to provide for autonomous switching between linear and resonant nonlinear modes of operation; and to provide for bidirectional resonant nonlinear operation to accommodate complex beam driving signals.

Other objects and advantages of the invention will be apparent from the following description, the accompanying drawings and appended claims.

DETAILED DESCRIPTION OF THE INVENTION

Figure 1:
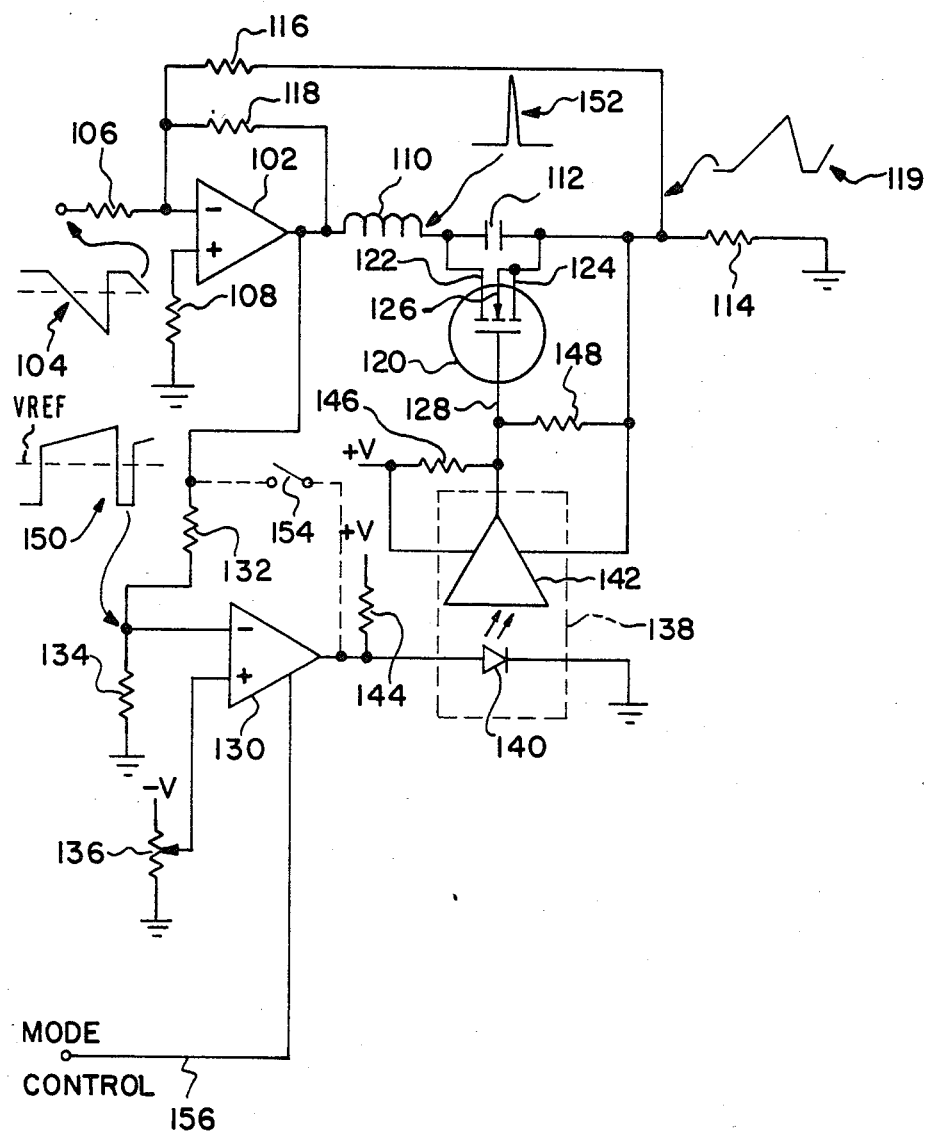
FIG. 1 is a schematic diagram of a deflection control circuit in accordance with the present invention providing linear and unidirectional resonant nonlinear operation.

In the deflection control circuit of FIG. 1, an operational amplifier 102 is connected to receive a beam positioning signal 104 on its negative input terminal through an input resistor 106. The positive input of the amplifier 102 is connected to ground potential through a resistor 108. The output of the operational amplifier 102 is connected to the deflection coil 110 of a cathode ray tube (CRT) which controls the position of the electron beam of the CRT along one coordinate. The deflection coil 110 is connected in series with capacitor means comprising a capacitor 112 which in turn is connected to ground potential through a current sensing resistor 114. The current sensing resistor 114 is typically of a very low resistance value, for example, 0.1 ohm.

Feedback means comprising resistors 116 and 118 are connected to the series combination of the capacitor 112 and the deflection coil 110 to provide a voltage representative of the current 119 through the deflection coil 110 to the negative input of the operational amplifier 102. First order feedback signals are passed to the operational amplifier 102 through the resistor 116 while second order feedback signals are passed to the operational amplifier 102 through the resistor 118.

A field effect transistor (FET) 120 is connected to operate as a bidirectional switch. The FET 120 selectively shunts or bypasses the capacitor 112 when activated to present a low resistance value between its drain terminal 122 and its source terminal 124 and when deactivated, presents a high resistance approximating an open circuit therebetween. The substrate electrode 126 is connected to the source electrode 124 as shown. A gate electrode 128 is driven by an optical coupler as will be described to selectively shunt the capacitor 112 for linear or resonant nonlinear operation of the deflection circuit. While a variety of field effect transistors (FETs) are commercially available for use in the deflection circuit, transistors identified as IRF331, IRF332 and 2N6770, available from International Rectifier, have been used in working embodiments.

The deflection circuit shifts between linear control of the CRT beam and resonant nonlinear control of the beam by means of monitoring the output signal from the operational amplifier 102. Preferably, a comparator circuit 130 is connected to receive the output signal from the operational amplifier 102 after scaling by divider resistors 132 and 134. A selectable reference signal is provided to the comparator circuit 130 by means of a variable resistor 136. The output signal from the comparator circuit 130 is passed to an optical coupler 138 comprising a light generating source, such as a LED 140, and a light activated circuit 142. A resistor 144 is connected to a positive power supply to provide bias on the light emitting diode 140. Biasing resistors 146 and 148 complete the circuit. A suitable optical coupler is available from Hewlett Packard and is identified as an HCPL-2601 optocoupler.

As long as the input signal 150 to the comparator circuit 130 from the operational amplifier 102 is above the reference signal, $V_{REF}$, set by the variable resistor 136, the FET 120 is activated to present a low resistance between the drain terminal 122 and the source terminal 124 such that the deflection coil 110 is controlled in a linear mode by the operational amplifier 102 in response to the beam positioning signal 104. However, if the input signal 150 falls below the reference signal, $V_{REF}$, the FET 120 is deactivated to present a high resistance approximating an open circuit between the drain terminal 122 and the source terminal 124. The transistion of the FET 120 from the low resistance value to the high resistance value causes a field collapse in the deflection coil 110 resulting in a voltage spike 152 at the junction between the deflection coil 110 and the capacitor 112. The deflection coil 110 and the capacitor 112 resonate to result in a field reversal by resonant nonlinear operation the same as in conventional resonant flyback deflection systems.

It is noted that the comparator circuit 130 and associated circuitry can be replaced by a switch 154 which selectively interconnects the output of the operational amplifier 102 to the input of the light emitting diode 140 to effect a switch from linear operation to nonlinear operation. The switch 154, by interconnecting the output of the operational amplifier to the input of the light emitting diode 140, ensures that the beam control signal at the output of the operational amplifier 102 is of an appropriate level for resonant nonlinear operation. Hence, if the switch 154 is closed during a period of normal linear operation, the linear operation continues until rapid movement or a retrace of the beam is called for. The switch 154 preferably comprises an electronic high speed switch even though it is shown as a conventional switch contact.

When the comparator circuit 130 and associated circuit elements are provided, a mode control signal can be provided on a conductor 156. The mode control signal on the conductor 156 selectively enables and disables the comparator circuit 130. If the comparator circuit 130 is disabled, the deflection circuit operates only in the linear mode. Hence, the mode control signal permits intervention into autonomous switching between linear and resonant nonlinear modes. Such control is desirable for certain applications, for example, where the circuit is computer controlled and may be switched from one mode to the other for an undesirably short period of time. Such a condition can be sensed and avoided by control of the mode control signal.

Figure 2:
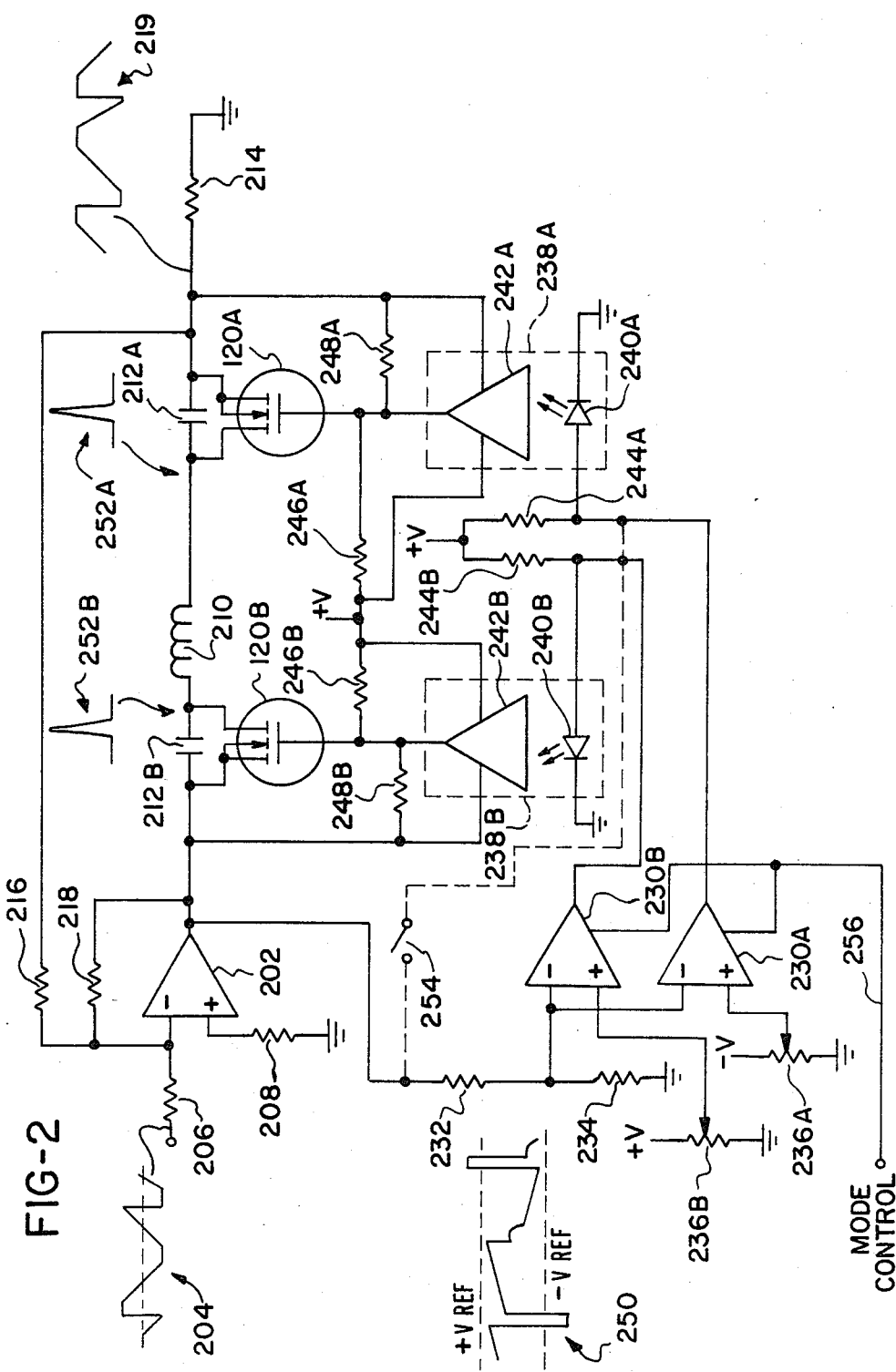
FIG. 2 is a schematic diagram of a deflection control circuit in accordance with the present invention providing linear and bidirectional resonant nonlinear operation.

FIG. 2 is a schematic diagram of a deflection circuit in accordance with the present invention which further provides for bidirectional resonant nonlinear operation. The circuit of FIG. 2 is similar to that of FIG. 1 except that a second capacitor has been interconnected between the output of the operational amplifier 102 and the deflection coil 110 and associated control circuitry for selectively shunting the second capacitor has been provided. Accordingly, corresponding elements of the circuit of FIG. 2 have been identified by the same numbers except in the 200 series of numbers and the duplication of the resonant capacitor, bypassing FET and associated control circuitry has been further distinguished by suffixing the appropriate 200 series numbers with the letters A and B.

Figure 3:
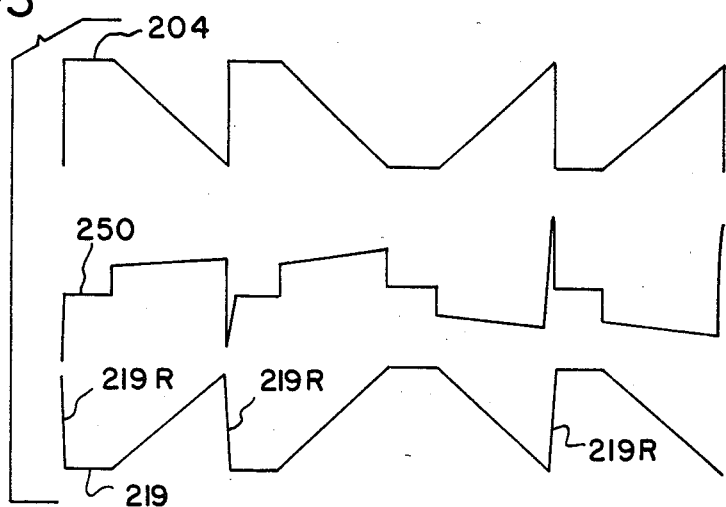
FIGS. 3 and 4 shown waveforms within the deflection control circuit of FIG. 2 illustrating differences in the retrace time which are effected by switching to resonant nonlinear operation during retrace.

The operation of the deflection circuit of FIG. 2 will be described with reference to FIGS. 3 and 4. FIG. 3 shows the waveforms 204, 250 and 219 when the mode control on the conductor 256 is such as to enable the operational amplifiers 230A and 230B and permit resonant nonlinear operation of the circuit when either the positive reference potential $+V_{REF}$ or the negative reference potential $-V_{REF}$ is exceeded by the input signal 250 to the operational amplifiers 230A and 230B. In FIG. 3, the rapid retrace time is indicated by the steeply sloping portions 219R of the waveform 219 which represents the current flow through the deflection coil 210.

Figure 4:
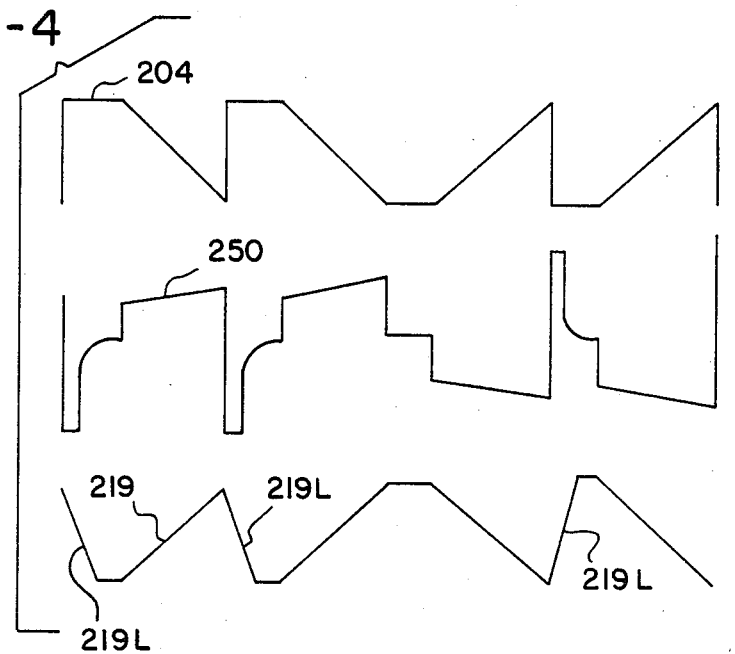

FIG. 4 shows the waveforms 204, 250 and 219 for the circuit of FIG. 2 with the mode control signal on the conductor 256 set to disable the operational amplifiers 230A and 230B and, hence, require operation of the circuit in only the linear mode. The increased retrace times are indicated by the portions 219L of the waveform 219 representative of the current through the deflection coil 210.

Operation of the circuit in the linear mode with the appropriate mode control signal on the conductor 256 is rather straightforward since the FETs 120A and 120B remain in a low resistance state to effectively bypass the capacitors 212A and 212B. Once the mode control signal on the conductor 256 is changed to permit combined linear and resonant nonlinear operation of the circuit, the waveforms of FIG. 3 result.

In the combined mode of operation, if the input signal to the comparator 230A goes below the reference potential $-V_{REF}$ set by the variable resistor 236A, the FET 120A is deactivated such that the deflection coil 210 and the capacitor 212A resonant to perform nonlinear flyback of the electron beam. As long as the input signal to the comparators 230A and 230B are within the limits set by the reference potentials, $+V_{REF}$ and $-V_{REF}$, the deflection coil 210 will be controlled linearly by the operational amplifier 202 as indicated by the central portion of the waveforms 204, 250 and 219 shown in FIGS. 2, 3 and 4. This central portion corresponds to a linear trace in one direction followed by a linear trace in the opposite direction.

After the two linear sweeps of the beam, retrace is again called for and the input signal to the comparator 230B goes above the reference potential $+V_{REF}$ set by the variable resistor 236B. In this event, the FET 120B is deactivated such that the deflection coil 210 and the capacitor 212B resonate to effect nonlinear flyback of the electron beam.

While the forms of apparatus herein described constitute preferred embodiments of this invention, it is to be understood that the invention is not limited to these precise forms of apparatus and that changes may be made therein without departing from the scope of the invention which is defined in the appended claims.

What is claimed is:

1. A deflection control circuit for a cathode ray tube having a deflection coil to position the beam of the cathode ray tube along one coordinate, said deflection control circuit having both linear and bidirectional nonlinear operating modes and comprising:
   amplifier means having an input for receiving beam positioning signals and an output for driving said deflection coil to position said cathode ray tube beam along said one coordinate;
   first and second capacitor means for effecting rapid retrace of said cathode ray tube beam by resonant nonlinear operation with said deflection coil in either direction along said one coordinate, said first and second capacitor means being connected in series with said deflection coil and on opposite sides thereof with the series combination of said first and second capacitor means and said deflection coil being connected to the output of said amplifier means;
   feedback means connected to the series combination of said first and second capacitor means and said deflection coil for providing a voltage representative of the current through said deflection coil to the input of said amplifier means; and
   first and second bidirectional switching means connected in parallel with said first and second capacitor means, respectively, said first and second switching means being activated to shunt said first and second capacitor means for linear operation of said deflection control circuit and selectively deactivated for rapid retrace of said cathode ray tube beam in either direction along said one coordinate by resonant nonlinear operation.

2. A deflection control circuit as claimed in claim 1 further comprising control means coupled to the output of said amplifier means for activating said first and second bidirectional switching means whereby the operating mode of said deflection control circuit is determined by conditions within said deflection control circuit.

3. A deflection control circuit as claimed in claim 2 wherein said control means comprises a first comparator circuit having one input connected to the output of said amplifier means and one input connected to a reference potential and a first optical coupler connected to said first bidirectional switching means and driven by said first comparator circuit to activate and deactivate said first bidirectional switching means, and a second comparator circuit having one input connected to the output of said amplifier means and another input connected to a reference potential and a second optical coupler connected to said second bidirectional switching means and driven by said second comparator circuit to activate and deactivate said second bidirectional switching means.

4. A deflection control circuit as claimed in claim 3 wherein said first and second bidirectional switching means each comprise a field effect transistor having source and drain terminals connected across the corresponding one of said first and second capacitor means and gate terminals connected to the corresponding one of said first and second comparator circuits, said field effect transistors presenting a low resistance between their source and drain terminals when activated and a high resistance approximating an open circuit when deactivated.

* * * * *